US005877944A

United States Patent [19]

Onizuka

[11] Patent Number: 5,877,944

[45] Date of Patent: Mar. 2, 1999

[54] ELECTRIC CONNECTION BOX FOR HOUSING WIRE HARNESS

[75] Inventor: Takahiro Onizuka, Nagoya, Japan

[73] Assignees: Harness System Technologies Research, Ltd., Nagoya; Sumitomo Wiring Systems, Ltd., Yokkaichi; Sumitomo Electric Industries, Ltd., Osaka, all of Japan

[21] Appl. No.: 810,109

[22] Filed: Feb. 25, 1997

[30] Foreign Application Priority Data

Feb. 28, 1996 [JP] Japan .................................... 8-041699

[51] Int. Cl.[6] ................................ H02B 1/20; H05K 1/14

[52] U.S. Cl. .......................... 361/826; 361/644; 361/736; 439/76.2

[58] Field of Search .................................... 361/630, 642, 361/826, 833, 644, 736; 337/293, 297; 439/621, 830, 76.2

[56] References Cited

U.S. PATENT DOCUMENTS 4,689,597 8/1987 Galloway et al. .
4,689,718 8/1987 Maue et al. .

FOREIGN PATENT DOCUMENTS 0 745 515 A1 12/1996 European Pat. Off. .
7-227027-A 8/1995 Japan .
2 078 022 A 12/1981 United Kingdom .
2 180 415 A 3/1987 United Kingdom .
WO 94/29145 12/1994 WIPO .

*Primary Examiner*—Leo P. Picard
*Assistant Examiner*—Jayprakash N. Gandhi
*Attorney, Agent, or Firm*—Oliff & Berridge, PLC

[57] ABSTRACT

An internal circuit, which is constituted by one of a printed circuit board and an FPC, and has small-current conductive paths arranged at a small pitch, is provided within a casing and of the electric connection box, and a small integrated fuse is mounted on the printed circuit board or the FPC, and fuses of the small integrated fuse are connected respectively to the small-current conductive paths, and electronic devices are mounted on the printed circuit board or the FPC.

11 Claims, 6 Drawing Sheets

ELECTRIC CONNECTION BOX FOR HOUSING WIRE HARNESS

BACKGROUND OF THE INVENTION

1. Field of the Invention

This invention relates to an electric connection box such as a junction box used for wire harnesses in an automobile, and more particularly to a construction in which a small integrated fuse (multifuse) is mounted within an electric connection box, and fuses of the small integrated fuse arranged at a small pitch can be connected to an internal circuit of the electric connection box.

2. Description of the Related Art

In a conventional fuse used as an electric protection part, a plurality of loads are connected to one fuse as shown in FIG. 8. For example, a fuse F1 of 7.5 A (ampere) is connected to loads A1 and A2, and a fuse F2 of 10 A is connected to loads A3 and A4. When one fuse is thus connected to the plurality of loads, it is necessary that the size of wires, connected to the fuse, should match the capacity of the fuse. The minimum capacity of the conventionally-used fuses is 5 A, and therefore the cross-sectional area of a conductor of the wire is 0.3 $mm^2$, and it is not possible to make the wire thinner or narrower. And besides, when the fuse melts, a plurality of loads, connected to this fuse, fail to be energized, thus inviting a problem that the loads can not be protected independently of each other. Furthermore, when the fuse of the minimum capacity of 5 A is used, a connector can not be formed into a small-pitch design, and a 3 mm pitch is a limit, and this is the reason why the electric connection box can not be formed into a compact size.

In view of the above problems, the present Applicant has earlier proposed a small integrated fuse (multifuse) having a number of integrated fuses of not more than 2 A, and wires, connected respectively to the fuses, can be made thinner, and each of the fuses is connected to a respective one of loads so that the loads can be protected independently of each other.

In the above integrated fuse, however, the pitch of the fuses is small, and therefore there has been encountered a problem that bus bars, used as an internal circuit of a conventional electric connection box, can not be connected to the fuses arranged at such a small pitch. When wires and press-connecting terminals, connected respectively to these wires, are used as an internal circuit, the press-connecting terminals can not be connected to the respective wires at a small pitch, which invites a problem that the wires can not be connected to the small integrated fuse.

SUMMARY OF THE INVENTION

The present invention has been made in view of the above problems, and an object of the invention is to provide an electric connection box in which an internal circuit of the electric connection box can be connected to a small integrated fuse, and terminals of a connector portion of the electrical connection box are juxtaposed at a small pitch, and a high-density wiring of the electrical connection box can be achieved, thereby achieving a compact design, and wires, connected to the connector portion, can be made thinner or narrower.

The above object of the invention has been achieved by an electric connection box including a casing and an internal circuit which is provided within the casing, and the internal circuit including a small-current conductive paths arranged at a predetermined distance on a printed circuit board or an FPC (flexible printed circuit), and a small integrated fuse mounted on the printed circuit board or the FPC; fuses of the small integrated fuse are connected respectively to the small-current conductive paths and electronic devices mounted on the printed circuit board or the FPC.

When the internal circuit of the electric connection box is constituted by the printed circuit board or the FPC as described above, the small-current conductive paths can be formed at a small distance, and therefore these conductive paths can be matched in current amount and pitch with the fuses of the low-current, small integrated fuse. Therefore, the small integrated fuse can be connected directly to the internal circuit of the electric connection box.

The tab-like terminals are connected to the small-current conductive paths of the printed circuit board or the FPC, and the connector portion is formed on the outer surface of the casing, and the tab-like terminals are projected into the connector portion.

When the tab-like terminals are soldered at one ends to the small-pitch, small-current conductive paths of the printed circuit board or the FPC, the tab-like terminals can be juxtaposed at a small pitch, and the connector portion, into which the tab-like terminals are projected, can be provided. This achieves a compact, high-density design of the electric connection box.

A multi-pole reception connector is fixedly mounted on an upper surface of the printed circuit board or the FPC, and pin-like terminals of an inverted L-shape which one ends of the pin-like terminals are connected to the small-current conductive paths of the printed circuit board or the FPC by soldering, and the other ends of the pin-like terminals are projected into the reception connector.

The reception connector is a multi-pole connector with 50 to 150 poles, and is mounted on the printed circuit board by soldering, and is preferably fitted and fixed relative to a mating connector by a bolt or a lever. The reception connector is of the multi-pole type since it receives the pin-like terminals connected at one ends to the small-current conductive paths, and despite this, the connector can be of a compact design.

The internal circuit includes at least one of bus bars and wires and press-connecting terminals connected respectively to the wires.

Preferably, with respect to the internal circuits, the bus bars are used to provide the large-current circuit connected to a power source, and the wires and the press-connecting terminals are used in combination to provide the medium-current circuit. When the bus bars and/or the wires and the press-connecting terminals are used, the printed circuit board or the FPC and such an internal circuit structure are housed in upper and lower layers in the electric connection box. Tabs projected from the bus bars, as well as external terminal portions of the press-connecting terminals, are juxtaposed at a relatively large pitch in a connector portion formed on an outer surface of the casing, as compared with the terminals connected to the small-current conductive paths.

An allowable current of each of the fuses of the small integrated fuse is not more than 2 A, and the tab-like terminals are juxtaposed at a small pitch of not more than 3 mm in said connector portion, and wires with the cross-sectional area of a conductor of 0.14 $mm^2$ are connected respectively to external terminals connected respectively to the tab-like terminals or the pin-like terminals.

Thus, when the allowable current of each of the fuses of the small integrated fuse is not more than 2 A, and the fuses are connected respectively to the loads, the loads can be protected independently of each other. It is not always necessary to connect one load to one fuse, but two loads may be connected to one fuse. Since the allowable current of each fuse is not more than 2 A, the wires to be connected can be made thin such that a cross-sectional area of their conductor is 0.14 $mm^2$ (0.14 sq), and the weight of a wire harness connected to the electric connection box can be reduced.

BRIEF DESCRIPTION OF THE DRAWINGS

The above and other objects and features of the present invention will be more apparent from the following description taken in conjunction with the accompanying drawings. In the accompanying drawings.

DETAILED DESCRIPTION OF THE PREFERRED EMBODIMENTS

Preferred embodiments of the present invention will now be described with reference to the drawings.

Figure 1:
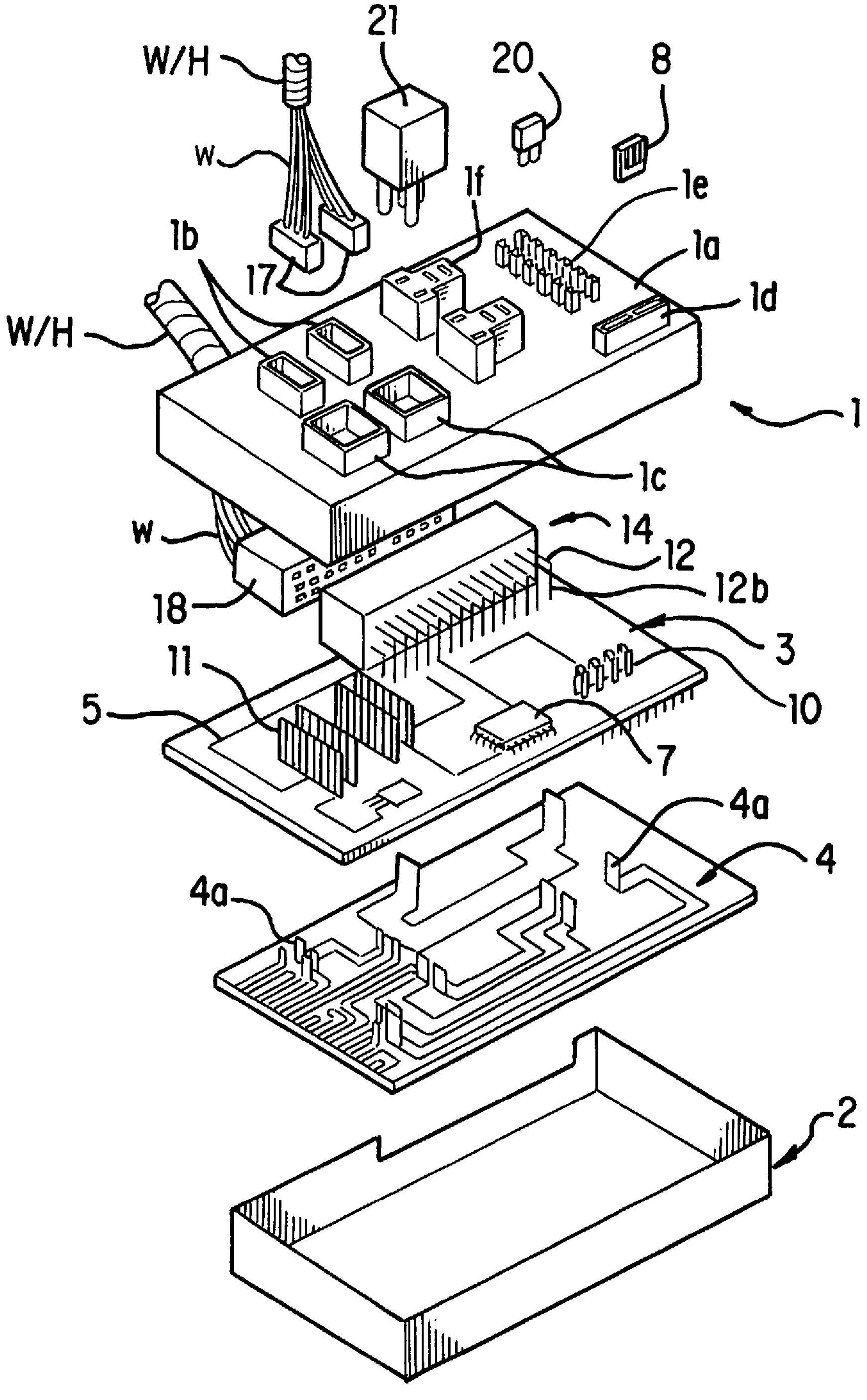
FIG. 1 is an exploded, perspective view of an electric connection box of the present invention.

As shown in FIG. 1, an electric connection box of the first embodiment of the invention comprises a casing, constituted by an upper case 1 and a lower case 2, and an internal circuit which is mounted within this casing, and this internal circuit comprises a printed circuit board 3 for small-current circuits, and bus bars 4 for large- and medium-current circuits, the circuit board 3 and the bus bar 4 being arranged in upper and lower layers.

The printed circuit board 3 has small-current conductive paths 5 (made of an electrically-conductive metallic plate) formed at a predetermined distance on opposite sides thereof, and a plurality of electronic devices 7, including a CPU, are connected by soldering to predetermined portions of the small-current conductive paths 5, respectively. A small integrated fuse (multifuse) 8 is mounted on the printed circuit board 3, and fuses 9 of the small integrated fuse 8 are connected directly to the small-current conductive paths 5 through terminals 10. More specifically, the small-current conductive paths 5 are provided on the printed circuit board 3 at a pitch corresponding to the pitch of the fuses 9 of the small integrated fuse 8 so that the conductive paths 5 can be connected to the respective fuses 9 through the respective terminals 10. In the embodiment, a part of the distance between the small-current conductive paths 5 can be arranged at a pitch of not more than 2.5 mm.

Figure 2:
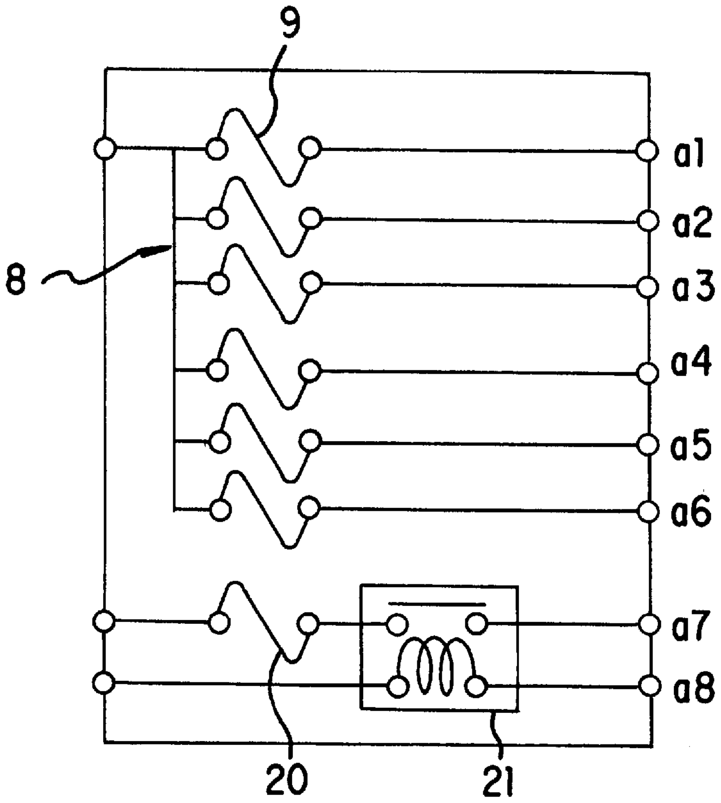
FIG. 2 is a circuit diagram of the electric connection box using a small integrated fuse.

An allowable current of each of the fuses 9 of the small integrated fuse 8 is 2 A, and the fuses 9 are connected respectively to loads a1 to a6 of not more than 2 A, as shown in FIG. 2. In FIG. 2, loads a7 and a8 are ones of more than 2 A, and are connected to tabs of the bus bars 4 through relays 21 and mini-fuses 20.

The electronic devices 7, including discrete parts with long legs and chip parts without legs, are adapted to be provided on the printed circuit board 3, and therefore can be mounted thereon by soldering.

Figure 3:
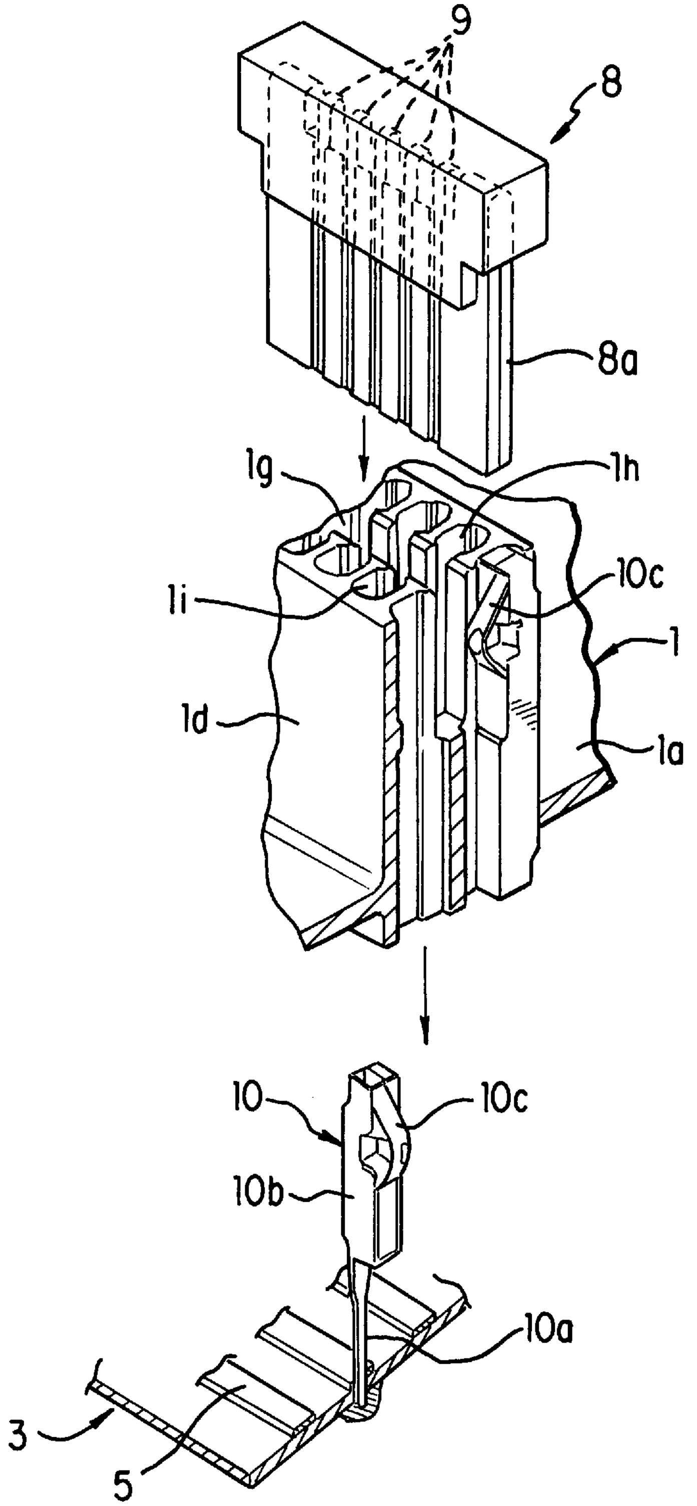
FIG. 3 is an exploded, perspective view showing a portion where the small integrated fuse is mounted.

As shown in FIG. 3, in the small integrated fuse 8, the plurality of fuses 9 each in the form of a strip-like melting metal material are arranged on opposite sides of an insulative resin plate 8*a* (folded in half), and are juxtaposed at a small pitch. The allowable current of these fuses 9 are not more than 2 A, and an electrical connection of each fuse 9 is made in such a manner that one side of the insulative plate 8*a* is contacted with an upstream side (power source side) of the electric circuit while the other side is contacted with a downstream side (load side) of the electric circuit.

Each of the terminals 10 for connecting the small integrated fuse 8 to the small-current conductive paths 5 has a needle-like connection portion 10*a* defined by its lower end portion, and this connection portion 10*a* is passed through a through hole, formed through the printed circuit board 3, and is connected by soldering to the small-current conductive path 5. A resilient contactor 10*c* of a generally V-shape is provided above the connection portion 10*a,* and is projected from a tubular portion 10*b* so as to resiliently contact the fuse 9 to make an electrical connection therebetween.

Figure 4A:
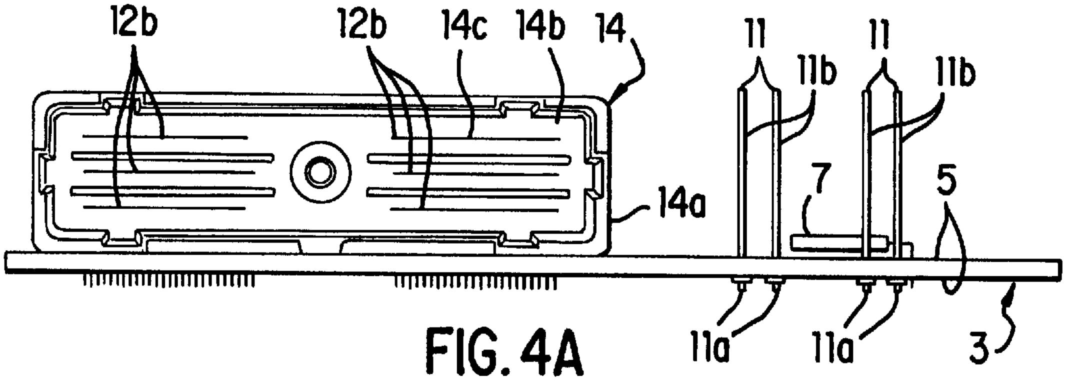
FIG. 4A is a front-elevational view of a printed circuit board.
Figure 4B:
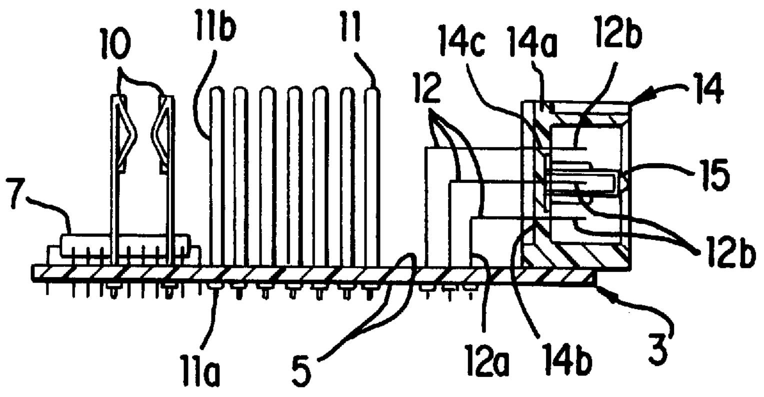
FIG. 4B is a cross-sectional view of the printed circuit board.

A plurality of tab-like terminals 11 are connected to the small-current conductive paths 5, and these terminals 11 are projected into connector portions 1*b* formed on the upper case 1. More specifically, as shown in FIGS. 4A and 4B, each tab-like terminal 11 has a needle-like fixing portion 11*a* at its lower end, and an external terminal connection portion 11*b* extending upwardly from this fixing portion 11*a*. The fixing portion 11*a* is passed through a through hole, formed through the printed circuit board 3, and is soldered to the small-current conductive path 5, and the external terminal connection portion 11*b* is projected into the connector portion 1*b*. The tab-like terminals 11 are juxtaposed on the printed circuit board 3 at a small pitch of not more than 3 mm, and therefore the terminals 11 are projected into the connector portion 1*b* on the upper case 1 at a small pitch of not more than 3 mm.

Pin-like terminals 12 of an inverted L-shape are connected at their one ends to the small-current conductive paths 5 by soldering, and the other ends of the pin-like terminals 12 are projected into a multi-pole reception connector 14 fixedly mounted on the printed circuit board 3.

As shown in FIGS. 4A and 4B, the reception connector 14 is a multi-pole connector with 50 to 150 poles, and is made of a resin, and is mounted on the printed circuit board 5 by soldering. The reception connector 14 includes a housing 14*a* with an open side, and a plurality of through holes 14*c* are formed through a closed wall 14*b* of this housing 14*a,* and external terminal connection portions 12*b* of the pin-like terminals 12 are projected respectively through these through holes 14*c* into a connector fitting portion of the housing 14*a*. The opening in the connector fitting portion is disposed in a plane perpendicular to the printed circuit board 3, and a mating connector 18 can be fitted into the connector fitting portion from a lateral side.

A bolt 15 for fixing the mating connector 18 projects from a central portion of the closed wall 14*b,* and by tightening the bolt 15, the mating connector 18, fitted in the reception connector 14, is fixed thereto. The reception connector 14 may be a lever-type connector. The reception connector 14 may have brackets which are formed on the lower end thereof, and have mounting holes, in which case the reception connector 14 is fixed to the printed circuit board 3 by bolts.

The pin-like terminals 12 for the reception connector 14 are connected to the small-current conductive paths 5 arranged at a pitch of 2 mm on the printed circuit board 3, and therefore these pin-like terminals 12 are received in the reception connector 14 at a small pitch. Therefore, although the reception connector 14 is of the multi-pole type, its overall size can be made small. In the embodiment, a part of the distance between these pin-like terminals 12 received in the reception connector 14 can be juxtaposed at a pitch of not more than 2.5 mm.

The terminals 11, projected into the connector portions 1*b,* and the terminals 12, projected into the reception connector 14, are connected to their respective mating external terminals (not shown) mounted in the mating connectors 17 and 18 fitted in the connector portions 1*b* and the reception connector 14, and electrically connect load-side external circuits to the small-current conductive paths 5. Wire w, connected respectively to the external terminals of the mating connectors 17 and 18, have such a small diameter that a cross-sectional area of their conductor is 0.14 $mm^2$ (0.14 sq), since these wires are connected to the fuses 9 of not more than 2 A in the small integrated fuse 8 mounted on the small-current conductive paths 5. With this arrangement, about 60% of wires w connected to the electric connection box can be constituted by the above small-diameter wires (0.14 $mm^2$), so that a wire harness W/H, connected to the load-side electronic parts, can be reduced in outer diameter; and also can be reduced in weight.

Figure 5:
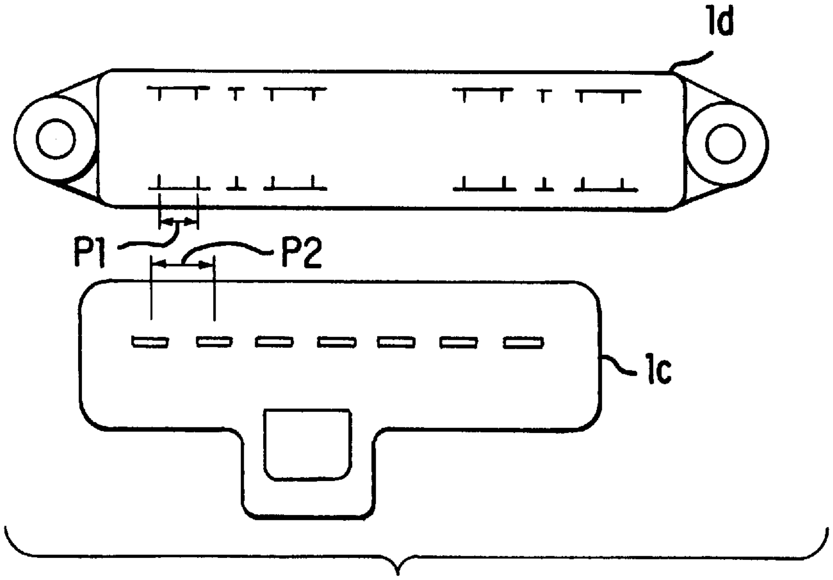
FIG. 5 is a schematic view showing a comparison of terminal pitches.

The bus bars 4, provided below the printed circuit board 3, conduct large and medium currents as of a power source, and tabs 4*a* for connection to external terminals are formed on predetermined portions of the bus bars 4. The tabs 4*a* are juxtaposed at a relatively large pitch as compared with the tab-like terminals 11 connected to the small-current conductive paths 5, and the tabs 4*a* are projected into connector portions 1*c,* mini-fuse fitting portions 1*e* and so on which are formed on the upper case 1 as described later. The pitch P2 of the tabs 4*a* on the bus bars 4 is different from the pitch P1 of the projected tab-like terminals 11 connected to the small-current conductive paths 5, as shown in FIG. 5.

The connector portions 1*b* and 1*c,* a small integrated fuse-fitting portion 1*d,* the fitting portions 1*e* for receiving the mini-fuses 20 as in the conventional construction, and mounting portions 1*f* for mounting the relays 21 thereon as in the conventional construction are formed on an outer surface 1*a* of the upper case 1. As shown in FIG. 3, the small integrated fuse-fitting portion 1*d* has an opening 1*g* for receiving the insulative plate 8*a* of the small integrated fuse 8 from the upper side, and connection terminal-fitting recesses 1*h* and 1*i* provided on opposite sides of the opening 1*g,* each pair of recesses 1*h* and 1*i* facing the associated fuse 9. An opening (not shown) is formed through one side wall of the upper case 1, and a mating connector-fitting side of the reception connector 14 is exposed to the exterior through this opening.

In the electric connection box of the above construction, since the small-current internal circuit is constituted by the printed circuit board 3, the small-current conductive paths 5 can be formed at a small pitch, and therefore the small integrated fuse 8 can be used. With this construction, the interior of the electric connection box can be formed into a high-density design, and the overall size of the electric connection box can be made compact or small.

Figure 6:
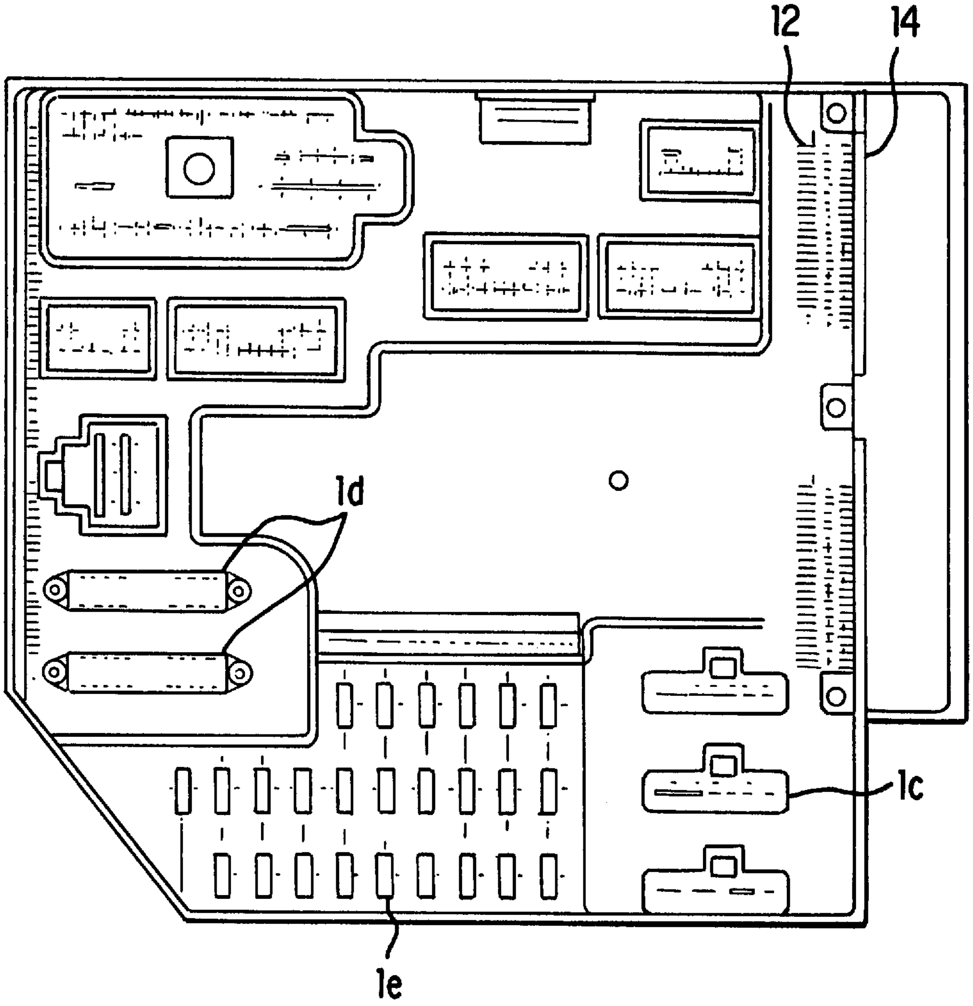
FIG. 6 is a plan view of a modification of the first embodiment of the electric connection box.

FIG. 6 shows a modification of the first embodiment, and as shown in this Figure, small-pitch connector portions 1*b,* large-pitch connector portions 1*c,* small integrated fuse-fitting portions 1*d,* a reception connector 14, and mini-fuse mounting portions 1*e* are mounted at a high density on an upper surface of an upper case 1 of the electric connection box.

Figure 7:
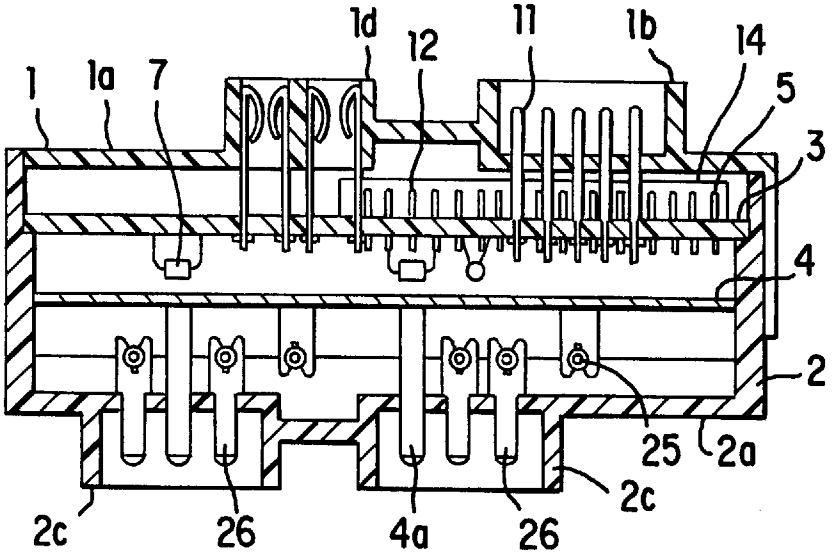
FIG. 7 is a cross-sectional view of a second embodiment of the electric connection box.
Figure 8:
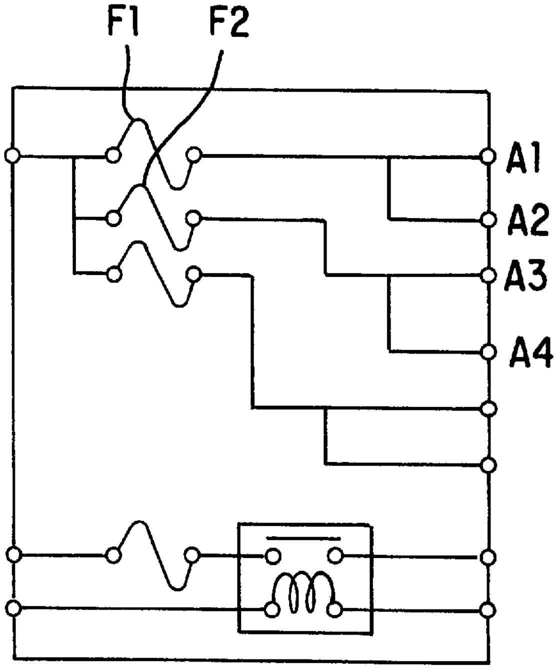
FIG. 8 PRIOR ART
FIG. 8 is a circuit diagram of a conventional electric connection box.

FIG. 7 shows a second embodiment of an electric connection box, and in this electric connection box, an internal circuit comprises a small-current circuit constituted by a printed circuit board 3, a large-current circuit constituted by bus bars 4, and a medium-current circuit constituted by wires 25 and press-connecting terminals 26 connected respectively to the wires 25. These circuits are housed in layers in the electric connection box. Each of the wires 25, constituting the medium-current circuit, is an ordinary wire whose conductor has a cross-sectional area of not less than 0.3 $mm^2$ corresponding to an allowable current of the fuse 20.

The present invention is not limited to the above embodiments, and the small-current internal circuit may be constituted by an FPC (flexible printed circuit) instead of the printed circuit board. In the FPC, small-current conductive paths, formed by conductive foils or thin wires, are covered with resin sheets at its upper and lower surfaces. In the case where the FPC is used to provide the small-current circuit, also, it is preferred that the conductive paths be arranged at a pitch corresponding to the pitch of the fuses 9 of the small integrated fuse 8, and that tab-like terminals, soldered respectively to the conductive paths of the FPC, be connected to the fuses 9.

As is clear from the above description, in the electric connection box of the present invention, the small-current internal circuit is constituted by the printed circuit board or the FPC, and therefore the small-current conductive path can be formed at a small pitch, and with this construction the small integrated fuse can be mounted on the electric connection box. Therefore, the loads or parts whose allowable current value is not more than 2 A can be protected independently of each other by the fuses of the small integrated fuse.

The terminals to be projected into the connectors can be juxtaposed on the printed circuit board at a small pitch, and therefore the connector can have a more compact design. And besides, the interior of the electric connection box can be formed into a high-density design, and the overall size of the electric connection box can be made compact or small.

Furthermore, the wires, connected to the terminals connected to the small-current conductive paths, through the external terminals, need only to pass a small current of not more than 2 A therethrough, and therefore the cross-sectional area of a conductor of these wires can be as small as not more than 14 $mm^2$. As a result, the wire harness, connecting the electronic parts (loads) to the electric connection box, can also be reduced in diameter and weight.

The foregoing description of a preferred embodiment of the invention has been presented for purpose of illustration and description. It is not intended to be exhaustive or to limit the invention to the precise form disclosed, and modifications and variations are possible in light of the above teachings or may be acquired from practice of the invention. The embodiment was chosen and described in order to explain the enable one skilled in the art to utilize the invention in various embodiments and with various modifications as are suited to the particular use contemplated. It is intended that the scope of the invention be defined by the claims appended hereto, and their equivalents.

What is claimed is:

1. An electric connection box comprising:
   - a casing; and
   - an internal circuit which is provided within said casing, said internal circuit including:
     - a small-current conductive paths arranged at a predetermined distance on a printed circuit board or a flexible printed circuit;
     - a small integrated fuse mounted on said printed circuit board or said flexible printed circuit, the small integrated fuse including an insulative plate and a plurality of fuses, each of the plurality of fuses being disposed on opposing outer sides of the insulative plate, wherein the plurality of fuses are connected respectively to said small-current conductive paths; and
     - electronic devices mounted on said printed circuit board or said flexible printed circuit.

2. An electric connection box according to claim 1, wherein said casing comprising:
   - a connector portion formed on an outer surface of said casing, and
   - said internal circuit further including:
     - tab-like terminals connected to said small-current conductive paths of said printed circuit board or said FPC, said tab-like terminals projected into said connector portion.

3. An electric connection box according to claim 1, wherein said internal circuit further including:
   - a multi-pole reception connector fixedly mounted on an upper surface of said printed circuit board or said FPC; and
   - pin-like terminals of an inverted L-shape which one ends of said pin-like terminals are connected to said small-current conductive paths of said printed circuit board or said FPC, and the other ends of said pin-like terminals are projected into said reception connector.

4. An electric connector box according to claim 1, wherein said internal circuit further including:
   - at least one of bus bars and wires and press-connecting terminals connected respectively to said wires.

5. An electric connection box according to claim 1, wherein a part of a distance between said small-current conductive paths is arranged at a pitch of not more than 2.5 mm.

6. An electric connection box according to claim 1, wherein an allowable current of each of said fuses of said small integrated fuse is not more than 2 A.

7. An electric connection box according to claim 2, wherein said tab-like terminals are juxtaposed at a pitch of not more than 3 mm.

8. An electric connection box according to claim 2, wherein wires with a cross-sectional area of a conductor of not more than 0.14 $mm^2$ are connected respectively to external terminals connected respectively to said tab-like terminals.

9. An electric connection box according to claim 3, wherein a part of said pin-like terminals are juxtaposed at a pitch of not more than 2.5 mm.

10. An electric connection box according to claim 3, wherein wires with a cross-sectional area of a conductor of not more than 0.14 $mm^2$ are connected respectively to external terminals connected respectively to said pin-like terminals.

11. The electric connection box according to claim 1, wherein the insulative plate has first an second opposing sides and each fuse of said plurality of fuses is disposed such that said first side of the insulative plate is contacted with a power source side of an electric circuit and said second side of the insulative plate is contacted with a load side of the electric current.

* * * * *